United States Patent [19]

Kumamoto et al.

[11] Patent Number: 4,691,378
[45] Date of Patent: Sep. 1, 1987

[54] TUNER FOR TELEVISION RECEIVER

[75] Inventors: Kenichiro Kumamoto, Tokyo; Akira Sato, Kanagawa; Koichi Ohya, Tokyo; Koichi Matsuda, Kanagawa, all of Japan

[73] Assignee: Sony Corporation, Tokyo, Japan

[21] Appl. No.: 807,739

[22] Filed: Dec. 11, 1985

[30] Foreign Application Priority Data

Dec. 24, 1984 [JP] Japan ................... 59-272660

[51] Int. Cl.<sup>4</sup> ............... H04B 1/10; H04B 1/08
[52] U.S. Cl. ................... 455/301; 455/189; 455/349
[58] Field of Search ............ 455/183, 189, 190, 300, 455/301, 347, 349; 334/85

[56] References Cited

U.S. PATENT DOCUMENTS

| 3,643,168 | 2/1972 | Manicki | 455/300 |
| 3,723,882 | 3/1973 | Carlson | 455/189 |
| 4,569,084 | 2/1986 | Takahama | 455/301 |

Primary Examiner—Jin F. Ng
Attorney, Agent, or Firm—Lewis H. Eslinger; Alvin Sinderbrand

[57] ABSTRACT

A tuner for a television receiver is designed for minimal size and to have a series of external terminals placed along one side thereof. An electronic tuning section including several local oscillator circuits is located within a common shielding case and a phase locked loop channel selection circuit is also located within the case in an isolated compartment thereof. The channel selection circuit and the local oscillator circuits all lie along a straight line parallel to and adjacent one end of the case.

4 Claims, 5 Drawing Figures

TUNER FOR TELEVISION RECEIVER

BACKGROUND OF THE INVENTION

1. Field of the Invention

This invention relates generally to a tuner and, more particularly, is directed to a tuner for a television receiver for receiving a plurality of bands, such as VHF band and UHF band.

2. Description of the Prior Art

A prior art tuner for receiving, for example, VHF and UHF bands is constructed as shown in FIG. 1.

In FIG. 1, reference numeral 1 designates a shielding case of a tuner proper. This shielding case 1 incorporates therein an electronic tuning tuner circuit section 10. Reference numeral 2 designates another shielding case which incorporates therein a PLL system channel selection circuit section 20. That is, the prior art tuner shown in FIG. 1 comprises the electronic tuning tuner circuit section 10 and the PLL system channel selection circuit section 20. The electronic tuning tuner circuit section 10 will be described first. Referring to FIG. 1, at one side surface of the shielding case 1, there is provided an input terminal 1a to receive a high frequency (RF) signal from the outside. The signal supplied to the input terminal 1a is supplied to a tuning circuit 11V formed by a diode, such as a variable capacitor (vari-cap) diode and the like for forming a VHF tuner. Also, this signal is supplied to a tuning circuit 11U formed similarly by a diode, such as a vari-cap diode and the like for forming a UHF tuner. The signal from the tuning circuit 11V is supplied through a high frequency amplifier 12V and a tuning circuit 13V to a mixer 14V in which it is mixed with the signal from a local oscillator 15V to be an intermediate frequency (IF) signal. The intermediate frequency signal from the mixer 14V is delivered to an output terminal 1b.

In like manner, the signal from the tuning circuit 11U is supplied through a high frequency amplifier 12U and a tuning circuit 13U to a mixer 14U in which it is mixed with the signal from a local oscillator 15U to be an intermediate frequency (IF) signal. The intermediate frequency signal from the mixer 14U is delivered to the output terminal 1b via the mixer 14V which, at that time, operates as an amplifier. Reference numeral 16 designates a shielding plate. Reference numeral 1c designates a power supply terminal, 1d an earth terminal, and 1e, 1f and 1g terminals to which UHF, VHF high and VHF low switching control signals are supplied and which are all aligned on one side surface of the shielding case 1. Thus, the electronic tuning tuner circuit section 10 is constructed.

Subsequently, the PLL system channel selection circuit section 20 of this tuner will be described. Referring to FIG. 1, the PLL system channel selection circuit section 20 is incorporated within the shielding case 2 as earlier noted. This PLL system channel selection circuit section 20 is formed of a channel-selection IC 21 and a crystal resonator 22 connected to the IC 21. The IC 21 is supplied with the detecting signals from the local oscillators 15V and 15U incorporated in the shielding case 1 and the tuning control signal from the IC 21 is supplied to vari-cap diodes and so on of the tuning circuits 11V, 11U, 13V and 13U incorporated in the shielding case 1. Reference numeral 2a designates a terminal through which a channel-selection control digital signal from a memory (not shown) or the like is supplied to the IC 21. Reference numerals 2b and 2c designate a power supply terminal and an earth terminal, respectively.

As described above, the reception and channel selection of the VHF band and the UHF band can be carried out. In this prior art tuner, a signal line 2d through which the tuning control voltage is supplied may be formed of a standard or normal wire because the signal passed therethrough is a DC signal. On the other hand, a signal line 2e through which the detecting signals from the local oscillators 15V and 15U are supplied to the IC 21 must be formed of a shielding wire because the signal is the high frequency signal. This increases the number of processes in the assembly process of the tuner to a television receiver set and is very disadvantageous in a manufacturing standpoint.

FIG. 2A is a circuit block diagram showing another example of the prior art tuner. In FIG. 2A, like parts corresponding to those of FIG. 1 are marked with the same references and will not be described in detail. In the prior art tuner shown in FIG. 2A, the shielding case 2 is close to and fixed to the shielding case 1 by soldering and so on to thereby remove the signal line 2e, which has to be shielded. Accordingly, if the above mentioned tuner is manufactured in advance, the assembly process for assembling the tuner into a television receiver set or the like can be made easy. In this case, however, the terminals 1c to 1g and the terminals 2a to 2c are provided on the different planes of the tuner so that in the assembly process of the tuner to the television receiver set, the connection work to the external terminals becomes complicated.

Therefore, it is proposed to align the positions of the terminals 1c to 1g and 2a to 2c in line by making the shape of the shielding case 2 same as that of the shielding case 1 as shown in FIG. 2B. According to this method, however, as will be clear from FIG. 2B, the space factor of the tuner grows worse extremely.

OBJECTS AND SUMMARY OF THE INVENTION

Accordingly, it is an object of this invention to provide a tuner for television receiver the overall arrangement of which can be made small in size and light in weight.

It is another object of this invention to provide a tuner for television receiver which can remove troubles, such as a mutual interference occurring between a tuning section and a channel selection section in spite of its small-sized and light-weighted overall arrangement thereof.

It is a further object of this invention to provide a tuner for television receiver in which the number of the assembly processes can be reduced and the assembly process can be made easy.

It is a still further object of this invention to provide a tuner for television receiver whose manufacturing cost can be reduced.

It is a yet further object of this invention to provide a tuner for television receiver which is excellent in space factor.

According to one aspect of the present invention, there is provided a tuner for television receiver comprising:

(a) a common shielding case;
(b) an electronic tuning tuner section having tuning circuits using a vari-cap diode and receiving a desired frequency by switching a plurality of receiving bands;

(c) a PLL (phase locked loop) system channel selection circuit section for supplying a predetermined tuning voltage to said tuning circuits, said electronic tuning tuner section and said PLL system channel selection circuit section both being incorporated in said common shielding case, said electron tuning tuner section having a plurality of local oscillator circuits corresponding to different receiving bands, said electronic tuning tuner section, said plurality of local oscillator circuits and said PLL system channel selection circuit section being located within said common shielding case at its one portion and substantially on one straight line;

(d) external connection terminals being aligned on one side surface of said shielding case for setting said electronic tuning tuner section and said PLL system channel selection circuit section in a desired condition;

(e) a shielding plate being mounted within said common shielding case in the direction substantially perpendicular to an alignment direction of said external connection terminals and bent at its predetermined portion so as to surround said PLL system channel selection circuit section;

(f) a high frequency input terminal and an intermediate frequency output terminal located to the side of said electronic tuning tuner section with respect to a connection point of a shielding plate to said common shielding case; and (g) a terminal for a channel selection control digital signal located to a side of said PLL system channel selection circuit section with respect to said connection point.

In accordance with the tuner for television receiver according to the present invention, the overall arrangement of the tuner can be made small in size and light in weight. Further, in spite of such small-sized and light-weighted arrangement, troubles, such as a mutual interference between the tuner section and the channel selection section can be removed. Furthermore, the number of assembly processes can be reduced and the tuner for television receiver of the present invention can be produced at a low manufacturing cost.

These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

In the prior art tuner, the channel selection circuit section is not limited to the use of the PLL system but various systems, such as a preset-volume system and so on can be used. Therefore, the electronic tuning circuit section incorporated in the shielding case had to be formed independently while being compatible with the channel selection circuits. While, owing to the recent development of the IC for the PLL, it becomes possible for the PLL system tuner to tune the high frequency band of CATV and so on that the prior art IC can not channel-select without difficulty.

Therefore, when an electronic tuning tuner section using a vari-cap diode and the like and a channel selection section of PLL system are integrally incorporated into a common shielding case so as to be one unit, the present invention is intended to provide an optimum circuit arrangement therefor.

Figure 1:
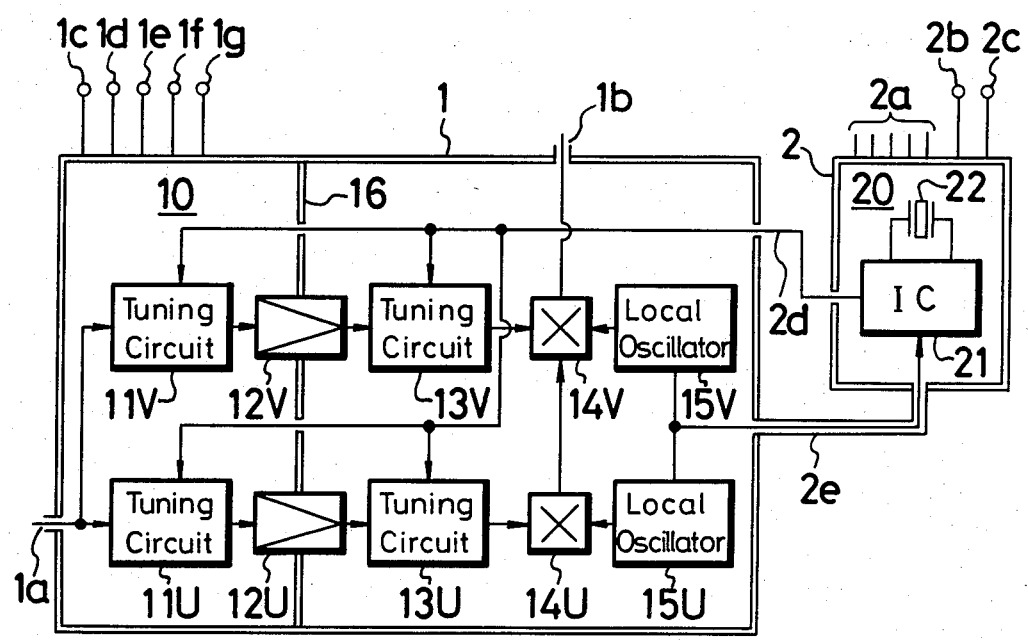
FIG. 1 and FIGS. 2A and 2B are respectively circuit block diagrams showing examples of a prior art tuner for television receiver.
Figure 2A:
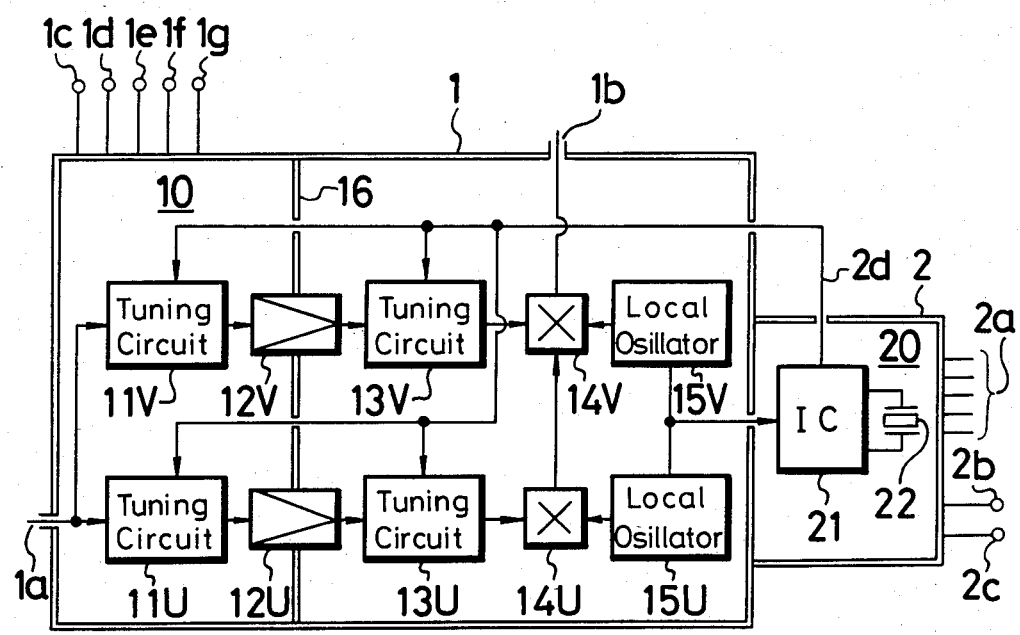
Figure 2B:
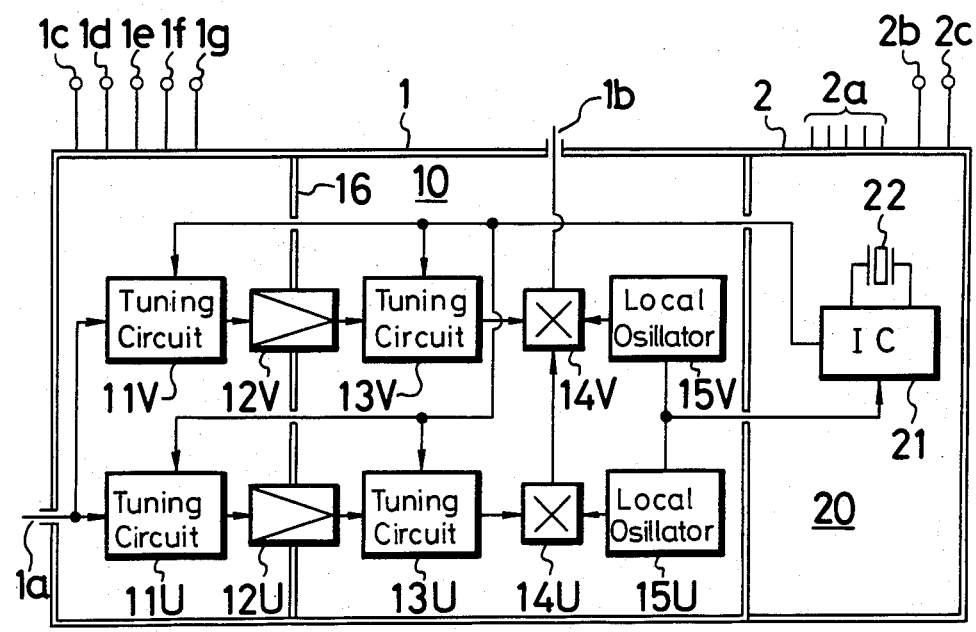
Figure 3A:
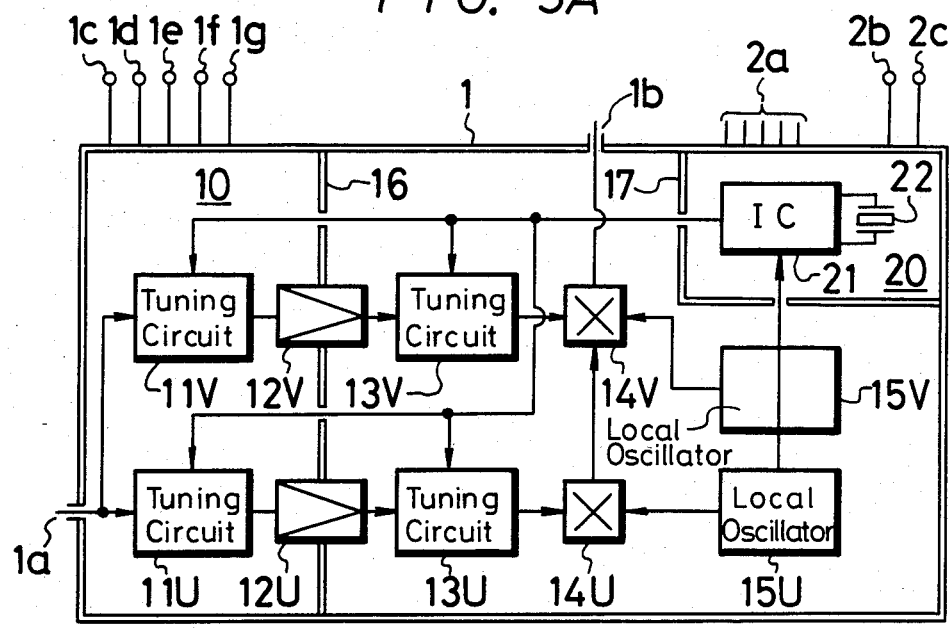
FIG. 3A is a circuit block diagram showing an embodiment of a tuner for television receiver according to the present invention.
Figure 3B:
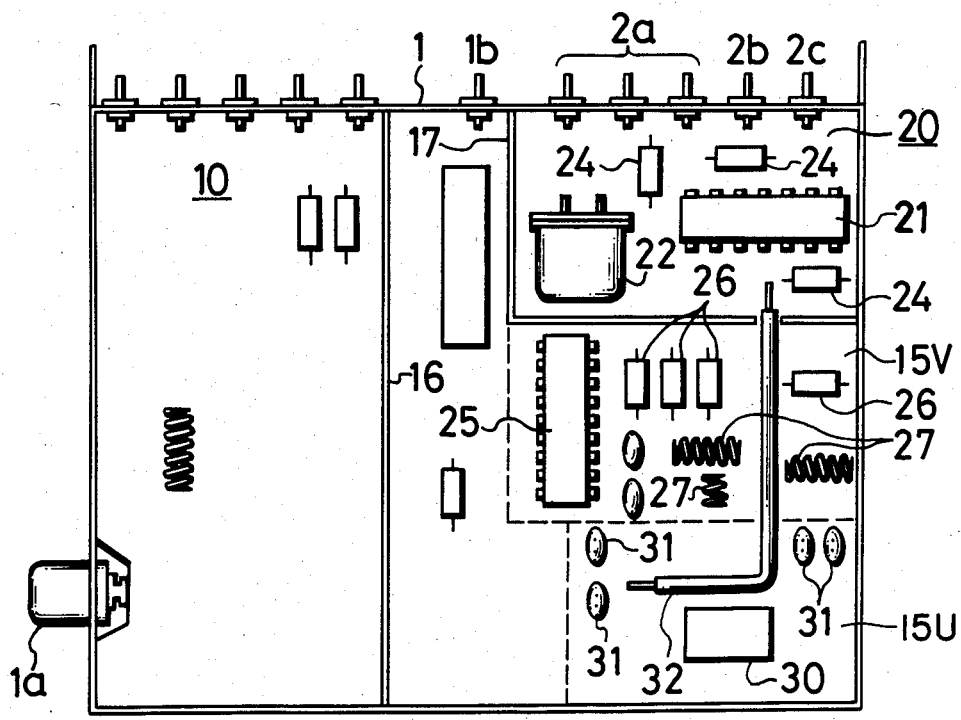
FIG. 3B is a top view illustrating a practical circuit arrangement of the tuner for television receiver of FIG. 3A.

Now, an embodiment of a tuner for television receiver according to this invention will hereinafter be described with reference to FIGS. 3A and 3B. In FIGS. 3A and 3B, like parts corresponding to those of FIG. 1 and FIGS. 2A and 2B are marked with the same references and will not be described in detail.

FIG. 3A illustrates an overall arrangement of the circuit elements provided within the tuner of the present invention.

Referring to FIG. 3A, the respective circuit elements 11V to 15V and 11U to 15U which constitute the electronic tuning tuner section 10, while the IC 21 and the crystal resonator 22 which constitute the PLL system channel selection circuit section 20 are incorporated into the common shielding case 1. In this case, as shown in FIG. 3A, the local oscillators 15V, 15U and the IC 21 are located substantially on the same straight line. Further, the terminals 1c to 1g and 2a to 2c are aligned with one another to one side surface of the shielding case 1. A shielding plate 17 is provided in the direction substantially perpendicular to the alignment line of these terminals 1c to 1g and 2a to 2c and which is bent at its predetermined portion to surround the PLL channel selection circuit section 20 including the IC 21 and the crystal resonator 22. The high frequency input terminal 1a and the intermediate frequency output terminal 1b are located to the the side of the electronic tuning tuner section 10 side with respect to the connection point of the shielding plate 17 with the shielding case 1. Further, the terminal 2a is located to the side of the PLL system channel selection circuit section 20 and to which the digital signal for channel selection control signal is applied.

FIG. 3B is a top view illustrating more specifically a practical layout of the circuit elements of the tuner of the present invention shown in FIG. 3A. The embodiment of the tuner for television receiver according to this invention will be described more fully with reference to FIG. 3B. Referring to FIG. 3B, the crystal oscillation element 22 of 4 MHz for a reference oscillation element used in the PLL system channel selection section 20 is mounted at the lower left-hand side corner thereof. The PLL IC 21 is mounted substantially at the center of the PLL system channel selection circuit section 20. In the IC 21, a prescaler for frequency-dividing an input signal and a PLL channel selection circuit are integrally formed as one chip IC. Other circuit elements 24 are mounted near this IC 21. In the PLL system channel selection circuit section 20, the output from the prescaler is frequency-divided by a predetermined value set by the channel selection control signal and is locked to the reference oscillation signal from the crystal oscillator 22.

The circuit section 15V encircled by a dotted line in FIG. 3B is the local oscillator for the VHF band, in which an IC 25 is adapted for such oscillation. The intermediate frequency output signal is processed by this IC 25 and then delivered from the output terminal

1b. A coil 27 is a resonant inductance for the VHF local oscillator 15V. The output therefrom is fed to the PLL system channel selection circuit section 20 by the mutual inductance coupling of the coil 27 to the pick-up line 32 that passes near the coil 27. Advantageously, pick-up line 32 is a wire covered by polyvinyl chloride. Reference numeral 26 designates peripheral circuit elements of the oscillator section 15V which are located around the IC 25. The terminals 2a to 2c are each formed as a through type capacitor terminal.

A broken line portion 15U of the under side represents a local oscillator for the UHF band. This UHF band local oscillator 15U comprises an oscillation transistor 30, peripheral circuit elements 31 and so on. The output therefrom is supplied through the pick-up line 32 to the PLL system channel selection circuit section 20.

In the present invention as described above, the PLL system channel selection circuit section 20 and the electronic tuning tuner section 10 are integrally incorporated within the single shielding case 1. In addition, the PLL system channel selection circuit section 20 is surrounded by the partition plate formed of the shielding plate 17, and the PLL system channel selection circuit section 20, the VHF local oscillator 15V and the UHF local oscillator 15U are mounted on the straight line and in this sequential order. Accordingly, these three circuit elements 20, 15V and 15U are coupled with one another very easily. The connection of these circuit elements 20, 15V and 15U can be easily realized by laying an insulated wire, or the pick-up line 32 between the UHF local oscillator 15U and the PLL system channel selection circuit section 20 through the local oscillator 15V as shown in FIG. 3B. Further, according to the above layout of these circuit elements, there occurs no useless space and hence it is possible to make the tuner compact in size.

Furthermore, according to the tuner of this invention, since the local oscillators 15V and 15U and the IC 21 are mounted substantially on the straight line, it is possible to easily deliver the detecting signal from the local oscillators 15V and 15U by only disposing the conductor thereon. In addition, since the long conductor is not needed to be laid around the circuit elements, there is little fear that troubles, such as mutual interference will occur between the electronic tuning tuner section 10 and the PLL system channel selection circuit section 20.

Further, since the circuit elements of this tuner are integrally mounted and most of the terminals are aligned on one side plane of the shielding case 1, the number of assembly processes of the tuner to the television receiver set can be reduced and hence the assembling process becomes easy.

Furthermore, since the shielding plate 17 is provided, the high frequency input terminal 1a and the intermediate frequency output terminal 1b are located on common shielding case 1 to the side of the electronic tuning tuner section 10 outside of the isolated compartment defined by the shielding plate 17 and the digital signal terminal 2a is located to the side of the PLL system channel selection circuit section 20 inside the isoltated compartment defined by the shielding plate 17, it is possible to reduce the mutual interference between the circuits more.

According to the present invention as set forth above, the overall of the tuner can be made small in size and light in weight. Further, although the tuner of this invention can be made small-sized and light-weighted, it is possible to remove troubles, such as a mututal interference between the electronic tuning tuner section 10 and the PLL system channel selection circuit section 20. Besides, the assembly processes of the tuner to the television receiver set can be reduced in number and hence becomes easy to thereby reduce the manufacturing cost.

The above description is given on a single preferred embodiment of the invention but it will be apparent that many modifications and variations could be effected by one skilled in the art without departing from the spirits or scope of the novel concepts of the invention so that the scope of the invention should be determined by the appended claims only.

We claim as our invention:

1. A tuner for a television receiver comprising:
    a substantially rectangular common shielding case having opposed elongated side walls connected by opposed end walls;
    electronic tuning means within said case for selectively receiving one of a plurality of frequencies within a plurality of frequency bands and including a respective tuning circuit means and a respective local oscillator circuit for each said frequency band, each said tuning circuit means including varicap diode means;
    phase locked loop channel selection means within said case for supplying a selected tuning voltage corresponding to the selected frequency to each of said tuning circuit means;
    said channel selection means and said local oscillator circuits being located along a first line substantially parallel to and adjacent one of said end walls of said case with said channel selection means being at one end of said first line nearest to one of said side walls of said case;
    a plurality of external connection terminals for setting said tuning means and said channel selection means to a desired condition, said connection terminals being located on said one side wall along a second line substantially perpendicular to said first line;
    shielding plate means within said case having a first portion extending substantially perpendicularly from said one side wall at a connection point thereon and a second portion angularly bent from said first portion and extending to said one end wall between said channel selection means and the closest one of said local oscillator circuits for defining an isolated compartment in said case in which said channel selection means is enclosed in separation from said tuning means;
    a high frequency input terminal and an intermediate frequency output terminal located on respective walls of said case outside of said compartment; and
    a channel selection terminal for receiving a channel selection control digital signal located on said one side wall of said case along said second line inside of said compartment.

2. A tuner for a television receiver according to claim 1, in which said plurality of frequency bands include a VHF band and a UHF and the respective local oscillator circuits are a VHF local oscillator circuit and a UHF local oscillator circuit and said channel selection means, said VHF local oscillator circuit and said UHF local oscillator circuit are located along said first line in this order.

3. A tuner for a television receiver according to claim 2, in which said VHF local oscillator circuit includes an oscillation coil carrying a first oscillation output signal and a pick-up line supplies a second oscillator output signal from said UHF local oscillator circuit to said channel selection means, said pick-up line passing near said oscillation coil of said VHF local oscillator circuit to pick up said first oscillation output signal from said VHF local oscillator circuit by mutual inductance coupling of said oscillation coil to said pick-up line and to transmit both oscillation output signals to said channel selection means.

4. A tuner for a television receiver according to claim 3, in which said pick-up line is a wire covered by polyvinyl chloride.

* * * * *